(12) United States Patent
Koga et al.

(10) Patent No.: US 6,538,493 B2
(45) Date of Patent: Mar. 25, 2003

(54) SEMICONDUCTOR INTEGRATED CIRCUIT

(75) Inventors: Toru Koga, Kawasaki (JP); Shinichi Yamada, Kawasaki (JP); Masato Takita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/021,059

(22) Filed: Dec. 19, 2001

(65) Prior Publication Data

US 2003/0006833 A1 Jan. 9, 2003

(30) Foreign Application Priority Data

Jul. 3, 2001 (JP) .................................... 2001-201942

(51) Int. Cl.⁷ .............................................. H03K 3/01
(52) U.S. Cl. ...................................................... 327/534
(58) Field of Search ................................. 327/530, 534, 327/535, 537, 538, 543, 544

(56) References Cited

U.S. PATENT DOCUMENTS

| | | | | |
|---|---|---|---|---|
| 5,448,198 A | * | 9/1995 | Toyoshima et al. | 327/530 |
| 5,461,338 A | * | 10/1995 | Hirayama et al. | 327/534 |
| 5,786,724 A | * | 7/1998 | Teggatz | 327/534 |
| 6,097,113 A | * | 8/2000 | Teraoka et al. | 307/125 |
| 6,191,615 B1 | * | 2/2001 | Koga | 326/81 |
| 6,232,793 B1 | * | 5/2001 | Arimoto et al. | 326/34 |
| 6,333,571 B1 | * | 12/2001 | Teraoka et al. | 307/125 |

OTHER PUBLICATIONS

Patent Abstract of Japan Publication No. 06–089574, Publication Date Mar. 29, 1994.
Patent Abstract of Japan Publication No. 05–210976, Publication Date Aug. 20, 1993.
Patent Abstract of Japan Publication No. 60–010656, Publication Date Jan. 19, 1985.

* cited by examiner

Primary Examiner—Jeffrey Zweizig
(74) Attorney, Agent, or Firm—Arent Fox Kintner Plotkin & Kahn, PLLC

(57) ABSTRACT

A first transistor is turned on during operation of a circuit block, to connect a substrate of the transistor to a first substrate voltage line. A second transistor is turned on during non-operation of the circuit block, to connect the substrate of the transistor to a second substrate voltage line. ON resistance of the second transistor is higher than that of the first transistor. A source-to-substrate voltage of the transistor being not in operation is set to be higher than that of the transistor being in operation. When a semiconductor integrated circuit switches from the operation state to the non-operation state, its substrate voltage changes gradually to a second substrate voltage. Charging/discharging currents of the substrate voltage can be dispersed so that it is possible to suppress current consumption in shifting from the operation state to the non-operation state and reduce a standby current in the non-operation state.

9 Claims, 13 Drawing Sheets

SEMICONDUCTOR INTEGRATED CIRCUIT

BACKGROUND OF THE INVENTION

1. Field of the Invention

The present invention relates to a technology for reducing current consumption of a semiconductor integrated circuit.

2. Description of the Related Art

Recently, a power source voltage (operation voltage) of a semiconductor integrated circuit has been lowering in order to satisfy the demands for low power consumption and a decrease in gate breakdown voltage, due to miniaturization of the structure of a transistor. The operation speed of the transistor decreases as the power source voltage lowers. In order to maintain a high-speed operation of the transistor, it is necessary to lower a threshold voltage of the transistor as the power source voltage lowers.

Moreover, a sub-threshold leakage current, which passes even when a gate-to-source voltage of the transistor is set to be 0V, increases as the threshold voltage lowers. Hence, when the threshold voltage is lowered in order to maintain the high-speed operation of the transistor, a standby current of the semiconductor integrated circuit increases.

The example of disposing a switching transistor between a source electrode and a power source line of the transistor in a circuit block is disclosed in Japanese Unexamined Patent Application Publication No. Hei 5-210976. Since the switching transistor is turned off during standby, it is possible to prevent the standby current from increasing even when the threshold voltage of the transistor is lowered.

However, the above technology has the disadvantage that, when there is a latch for holding data in the circuit block, the data held in the latch is destroyed because power supply is interrupted by the switching transistor. In order to prevent the destruction of the data, it is necessary to connect the circuit block including the latch directly to the power source line, not via the switching transistor. As a result, it is impossible to prevent the sub-threshold leakage current of the circuit block like the above during standby, which causes the disadvantage that the standby current cannot be reduced sufficiently.

Meanwhile, the example of changing a substrate voltage of the transistor between a non-operation state (standby state) and an operation state of the semiconductor integrated circuit is disclosed in Japanese Unexamined Patent Application Publication Nos. Sho 60-10656 and Hei 6-89574. Specifically, the threshold voltage of the transistor is high during a non-operation period, thereby reducing the leakage current. Further, the threshold voltage of the transistor is low during an operation period, thereby heightening drivability and improving operation speed of the transistor.

However, the technology for optimally switching from the standby state to the operation state and from the operation state to the standby state has not been disclosed conventionally. When the semiconductor integrated circuit shifts from the standby state to the operation state, it is preferable to change the substrate voltage to a predetermined voltage in a short time to allow its internal circuit to be ready for the operation as soon as possible. Further, when it shifts from the operation state to the standby state, it is preferable to minimize its current consumption and change the substrate voltage to the predetermined voltage. However, such technology has not been disclosed.

SUMMARY OF THE INVENTION

It is an object of the present invention to optimally control voltages to be supplied to an internal transistor in both a standby state and an operation state in order to reduce current consumption and, more particularly, to optimally switch from the standby state to the operation state and from the operation state to the standby state, in order to reduce the current consumption.

According to one of the aspects of the semiconductor integrated circuit of the present invention, a first transistor is turned on when a circuit block including an internal transistor is in operation, to connect a substrate of the internal transistor to a first substrate voltage line. A second transistor is turned on when the circuit block is not in operation, to connect the substrate of the internal transistor to a second substrate voltage line. ON resistance of the second transistor is higher than ON resistance of the first transistor. Further, the voltage of the first and second substrate voltage lines allows a source-to-substrate voltage of the internal transistor during the non-operation of the circuit block to be higher than a source-to-substrate voltage of the internal transistor during the operation of the circuit block.

In this semiconductor integrated circuit, a substrate voltage is deep during the non-operation state so that a threshold voltage (absolute value) of the internal transistor in the circuit block is high as compared with that during the operation state. Hence, it is possible to reduce a sub-threshold leakage current and a standby current. Since the ON resistance of the second transistor is high, the substrate voltage of the internal transistor changes gradually from a first substrate voltage to a second substrate voltage when the semiconductor integrated circuit switches from the operation state to the non-operation state. Charging/discharging currents of the substrate voltage can be dispersed so that it is possible to reduce the current consumption in shifting from the operation state to the non-operation state, by which further enables reduction in the standby current during the non-operation state. Especially, a peak current in shifting from the operation state to the non-operation state can be reduced.

Meanwhile, the substrate voltage is shallow during the operation state of the semiconductor integrated circuit so that the threshold voltage (absolute value) of the internal transistor in the circuit block is low as compared with that during the non-operation state.

Hence, realizing high-speed operation of the internal transistor further enables high-speed operation of the semiconductor integrated circuit. Since the ON resistance of the first transistor is low, the substrate voltage of the internal transistor changes quickly from the second substrate voltage to the first substrate voltage when the semiconductor integrated circuit switches from the non-operation state to the operation state. The substrate voltage turns to a predetermined voltage in a short time so that it is possible to allow the circuit block to be ready for the operation quickly.

According to another aspect of the semiconductor integrated circuit of the present invention, a ratio W1/L1 between a gate width W1 and a channel length L1 of the first transistor is larger than a ratio W2/L2 between a gate width W2 and a channel length L2 of the second transistor. By differentiating the sizes of the first and the second transistors as described above, the ON resistance can be adjusted easily and accurately.

According to another aspect of the semiconductor integrated circuit of the present invention, the semiconductor integrated circuit has a plurality of circuit blocks which individually includes an internal circuit and operates independently. A plurality of first transistors and a plurality of second transistors are formed respectively corresponding to the plurality of circuit blocks. In other words, the first and second transistors are individually turned on during operation of each of the corresponding circuit blocks. The second substrate voltage is supplied via the second transistor to the substrate of the internal transistor in the corresponding circuit block being not in operation. The first substrate voltage is supplied via the first transistor to the substrate of the internal transistor in the corresponding circuit block being in operation. The substrate voltage of the internal transistor can be set according to the operation states of each circuit block as described above so that the current consumption can be further reduced.

According to another aspect of the semiconductor integrated circuit of the present invention, a third transistor connects substrates of the plurality of circuit blocks being not in operation to each other. For example, when a circuit block switches from the operation state to the non-operation state, the substrate of the internal transistor in this circuit block is connected to the second substrate voltage not only via the second transistor corresponding to this circuit block, but also via the second transistors and the third transistors corresponding to the other circuit blocks being not in operation. In other words, the second transistor corresponding to the circuit block which has already been in non-operation state is used to change the substrate voltage of the circuit block which is to be switched to the non-operation state. Thus, the second transistors can be shared by a plurality of circuit blocks, whereby the substrate voltage of each circuit block can be speedily set to a predetermined voltage.

According to another aspect of the semiconductor integrated circuit of the present invention, a power source line supplies a power source voltage to each circuit in the circuit block. A fourth transistor connects the substrate to the power source line during operation of the circuit block. For this reason, when the semiconductor integrated circuit switches from the non-operation state to the operation state, the substrate voltage of the internal transistor in the circuit block is set to a predetermined value not only via the first transistor, but also via the fourth transistor. As a result, it is possible to change the substrate voltage to a predetermined voltage in a shorter time, whereby allows the circuit block to be ready for the operation speedily.

According to another aspect of the semiconductor integrated circuit of the present invention, the gates of the first transistor and the fourth transistor are controlled by a same control signal. Hence, it is possible to reduce the number of signal lines and further the layout area of the signal lines.

According to another aspect of the semiconductor integrated circuit of the present invention, a fifth transistor is turned on when the circuit block including the internal transistor is in operation, to connect a source of the internal transistor to a first power source line. A sixth transistor is turned on when the circuit block is not in operation, to connect the source of the internal transistor to a second power source line whose voltage is lower than that of the first power source line. ON resistance of the sixth transistor is higher than ON resistance of the fifth transistor.

In this semiconductor integrated circuit, the source of the internal transistor in the circuit block being not in operation is connected to the second power source line. Hence, a source-to-drain voltage (absolute value) of the internal transistor is low as compared with that during operation. Therefore, the leakage current of the internal transistor can be reduced and the standby current can be reduced. Since the ON resistance of the sixth transistor is high, a source voltage of the internal transistor decreases gradually when the semiconductor integrated circuit switches from the operation state to the non-operation state. A current from the source of the internal transistor to the second power source line can be dispersed so that it is possible to reduce the current consumption in shifting from the operation state to the non-operation state, and to further reduce the standby current in the non-operation state. Especially, the peak current in shifting from the operation state to the non-operation state can be reduced.

Meanwhile, the source of the internal transistor in the circuit block is connected to the first power source line during operation of the semiconductor integrated circuit. Hence, the source-to-drain voltage (absolute value) of the internal transistor is high as compared with that during non-operation. Accordingly, it is possible to operate the internal transistor quickly and further the semiconductor integrated circuit quickly. Because of low ON resistance of the fifth transistor, the substrate voltage of the internal transistor increases speedily when the semiconductor integrated circuit switches from the non-operation state to the operation state. The power source voltage turns to the predetermined voltage in a short time, whereby allows the circuit block to be ready for the operation speedily.

According to another aspect of the semiconductor integrated circuit of the present invention, a ratio W3/L3 between a gate width W3 and a channel length L3 of the fifth transistor is larger than a ratio W4/L4 between a gate width W4 and a channel length L4 of the sixth transistor. By differentiating the sizes of the fifth and the sixth transistors as above, the ON resistance can be adjusted easily and accurately.

According to another aspect of the semiconductor integrated circuit of the present invention, the semiconductor integrated circuit has a plurality of circuit blocks which individually includes the internal transistor and independently operates. A plurality of fifth transistors and a plurality of sixth transistors are formed respectively corresponding to the plurality of circuit blocks. The source of the internal transistor in the circuit block being not in operation is connected to the second power source line via the sixth transistor. The source of the internal transistor in the circuit block being in operation is connected to the first power source line via the fifth transistor. The power source voltage to be supplied to the sources of the internal transistors can be set according to the operations of each circuit block as described above so that the current consumption can be further reduced.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, the preferred embodiments of the present invention will be explained with reference to the drawings.

Figure 1:
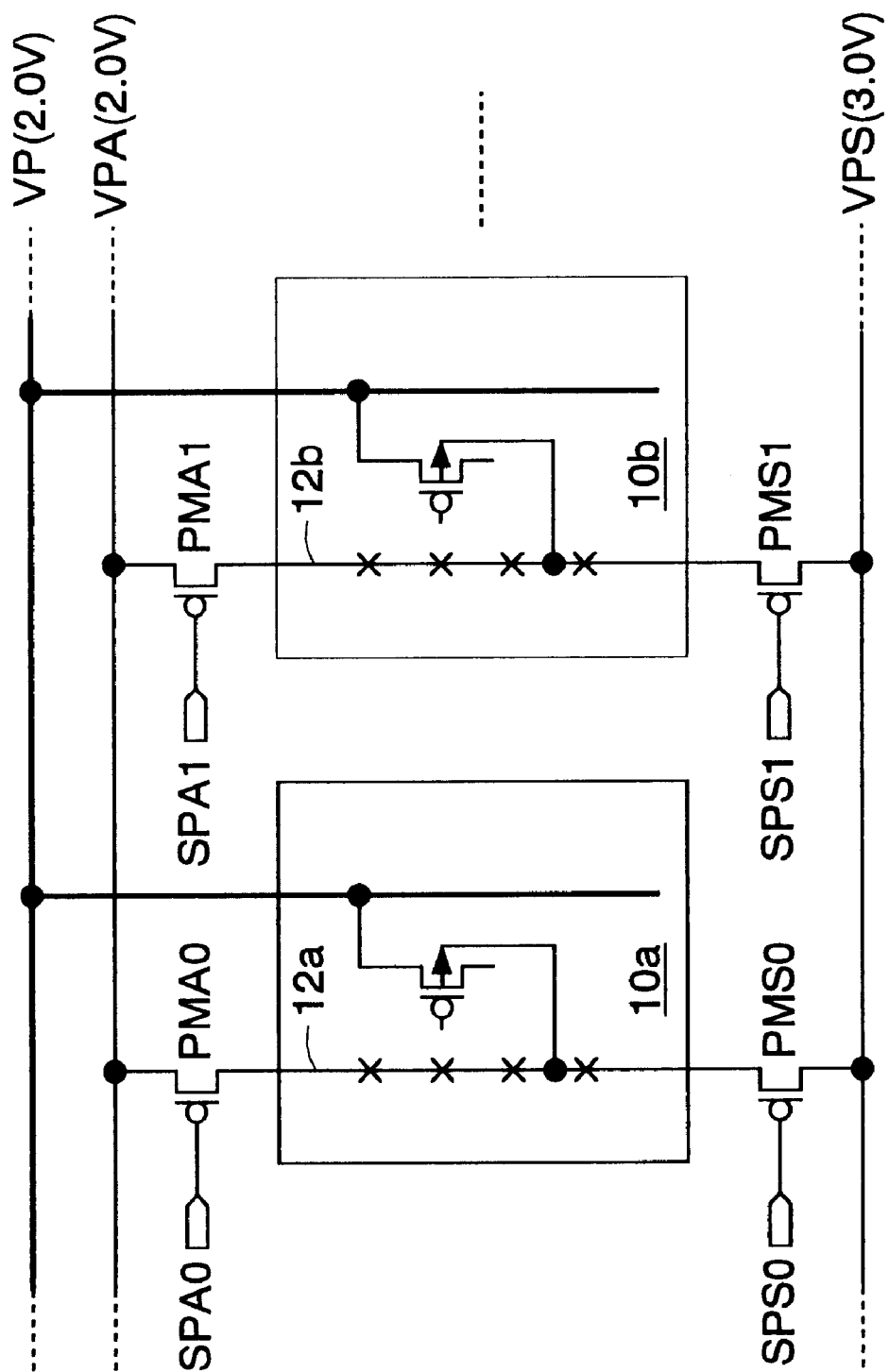
FIG. 1 is a block diagram showing a main part of a first embodiment according to the present invention.

FIG. 1 shows a main part of a first embodiment of a semiconductor integrated circuit according to the present invention. This semiconductor integrated circuit is formed on a silicon substrate as DRAM of a clock synchronous type, by using a CMOS process. FIG. 1 shows the layout area of pMOS transistors in a peripheral circuit of the DRAM. It should be mentioned here that the peripheral circuit is, for example, a logic circuit for operating a memory cell array. The DRAM has the layout area of nMOS transistors which are not shown in the drawing. An input/output circuit, a control circuit and the like are configured of these pMOS and nMOS transistors.

A plurality of circuit blocks 10a, 10b, . . . , each of which operates independently, are formed in the pMOS transistor area of the DRAM. A power source line VP for supplying a power source voltage (2.0 V) is wired to the circuit blocks 10a, 10b. The power source line VP is connected to source of pMOS transistors (internal transistors) in the respective circuit blocks 10a, 10b. The structures of the circuit blocks 10a, 10b are the same, and hence the circuit block 10a on the left side of the drawing will be explained in the following explanation.

A substrate (a substrate of the pMOS transistor) of the circuit block 10a is connected to a wire 12a via contacts shown by "X" in the drawing. The wire 12a is connected to a drain of a pMOS transistor PMA0 (the first transistor) and a drain of a pMOS transistor PMS0 (the second transistor). A source of the pMOS transistor PMA0 is connected to a first substrate voltage line VPA which supplies a first substrate voltage (2.0 V). A source of the pMOS transistor PMS0 is connected to a second substrate voltage line VPS which supplies a second substrate voltage (3.0 V).

A gate of the pMOS transistor PMA0 is controlled by a switching signal SPA0. The switching signal SPA0 changes to a low level when the circuit block 10a is in an operation state, to turn on the pMOS transistor PMA0. A gate of the pMOS transistor PMS0 is controlled by a switching signal SPS0. The switching signal SPS0 changes to the low level when the circuit block 10a is in a non-operation state (standby state), to turn on the pMOS transistor PMS0.

In the circuit block 10b on the right side of the drawing, a gate of a PMOS transistor PMA1 is controlled by a switching signal SPA1, and a gate of a pMOS transistor PMS1 is controlled by a switching signal SPS1. The switching signal SPA1 changes to the low level when the circuit block 10b is in the operation state, to turn on the pMOS transistor PMA1. The switching signal SPS1 changes to the low level when the circuit block 10b is in the non-operation state (standby state), to turn on the pMOS transistor PMS1. Namely, a substrate of the circuit block 10b is connected to the first substrate voltage line VPA or the second substrate voltage line VPS via a wire 12b.

Thus, the substrates of the circuit blocks 10a, 10b are connected to the substrate voltage line VPA or VPS, via the PMOS transistors PMA0, PMA1, PMS0, and PMS1 which can be operated independently. For this reason, the substrate voltage of each circuit block 10a, 10b can be set independently according to the operation of each block.

Figure 2:
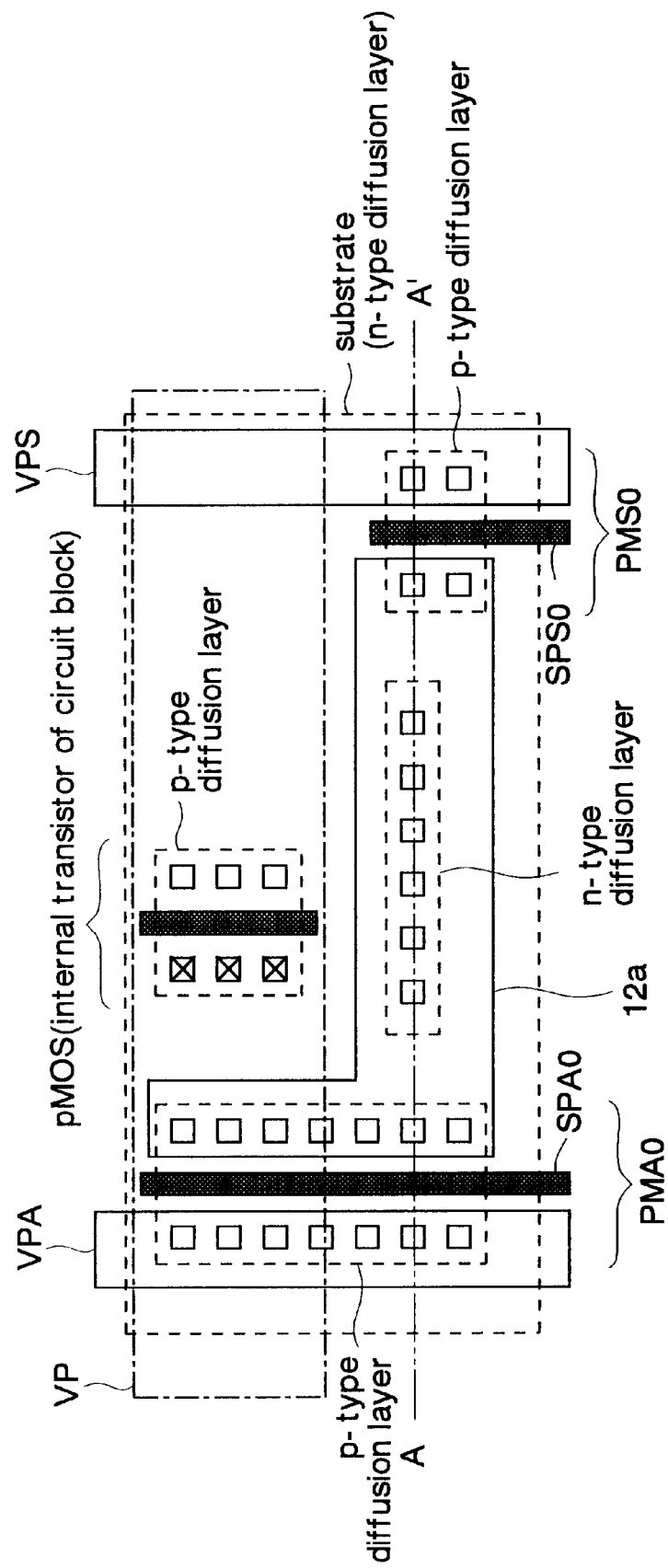
FIG. 2 is a view showing a layout of a circuit block in FIG. 1 in detail.

FIG. 2 shows a layout of the circuit block 10a shown in FIG. 1. Note that layouts of other circuit blocks (10b and the like) are the same as that shown in FIG. 2, although not particularly shown in the drawing. In the drawing, the broken lines show a diffusion layer area, the solid lines show a first wiring layer area which is made of aluminum or the like, and the chain lines show a second wiring layer area which is made of aluminum or the like. The diffusion layer is formed in the silicon substrate, the first wiring layer is formed on the silicon substrate via an insulator, and the second wiring layer is formed on the first wiring layer via an insulator.

A ratio W1/L1 (transistor size) between a gate width W1 and a channel length L1 of the pMOS transistor PMA0 is formed to nearly quadruple a ratio W2/L2 between a gate width W2 and a channel length L2 of the pMOS transistor PMS0. In other words, ON resistance of the pMOS transistor PMS0 nearly quadruples ON resistance of the PMOS transistor PMA0. Since the ON resistance of the respective pMOS transistors PMA0, PMS0 is set according to the transistor size, the ON resistance is adjusted easily and accurately. Incidentally, the channel lengths L1, L2 are equal to each other in this embodiment. The source of the pMOS transistor in the circuit block is connected to the power source line VP via contacts shown by "X" in the drawing.

Figure 3:
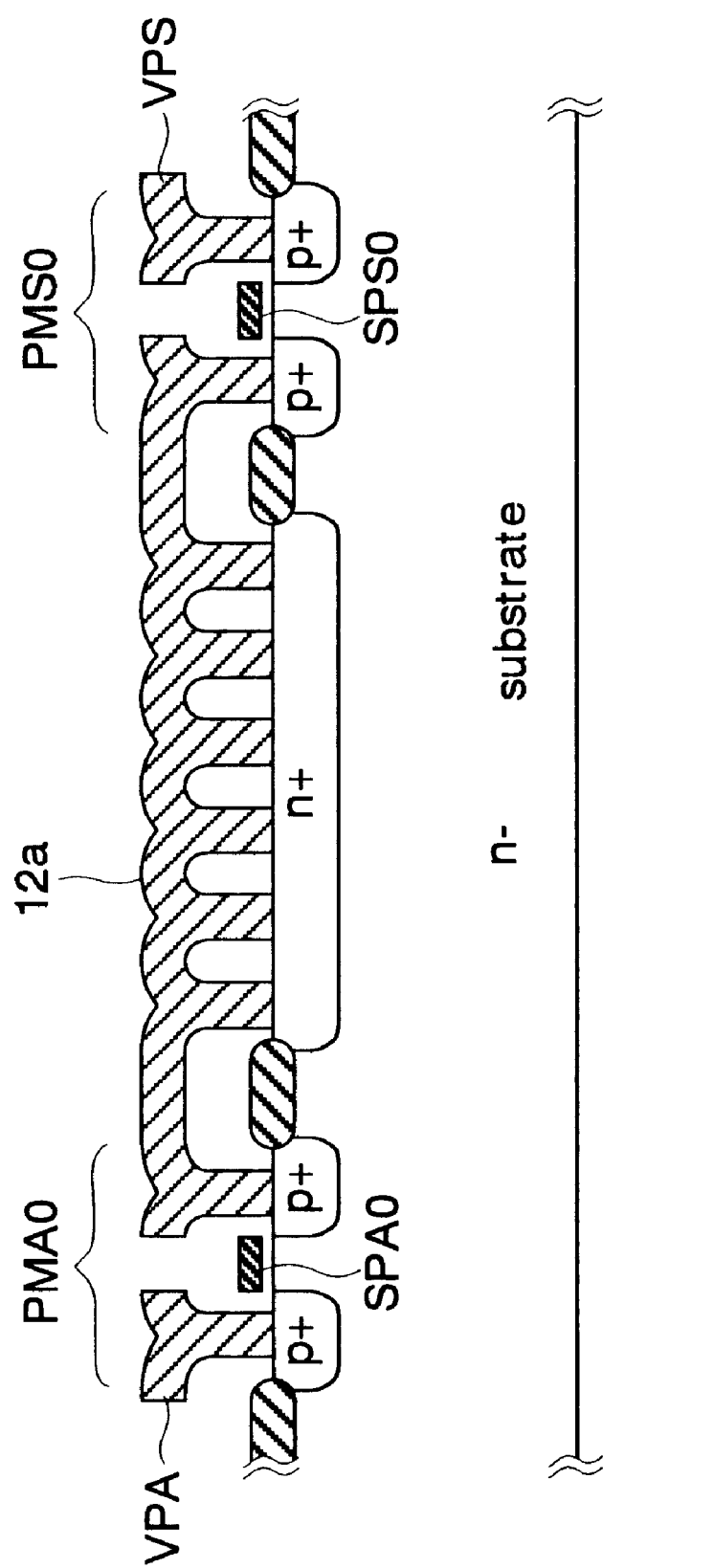
FIG. 3 is a sectional view taken along the A–A' line in FIG. 2.

FIG. 3 is a sectional view taken along the A–A' line in FIG. 2. In the drawing, "p+" shows a heavily doped p-type diffusion layer, "n+" shows a heavily doped n-type diffusion layer, and "n–" shows a lightly doped n-type diffusion layer. The wire 12a is connected to the first substrate voltage line VPA and the second substrate voltage line VPS via the pMOS transistor PMA0 and the pMOS transistor PMS0, respectively. The wire 12a is connected to the substrate of the pMOS transistor (n-well region) via contact holes and the n-type diffusion layer. The interface between the contact hole and the substrate is silicified and its resistance is low. Incidentally, the wire 12a may be formed of low-resistance polysilicon, instead of the aluminum.

Figure 4:
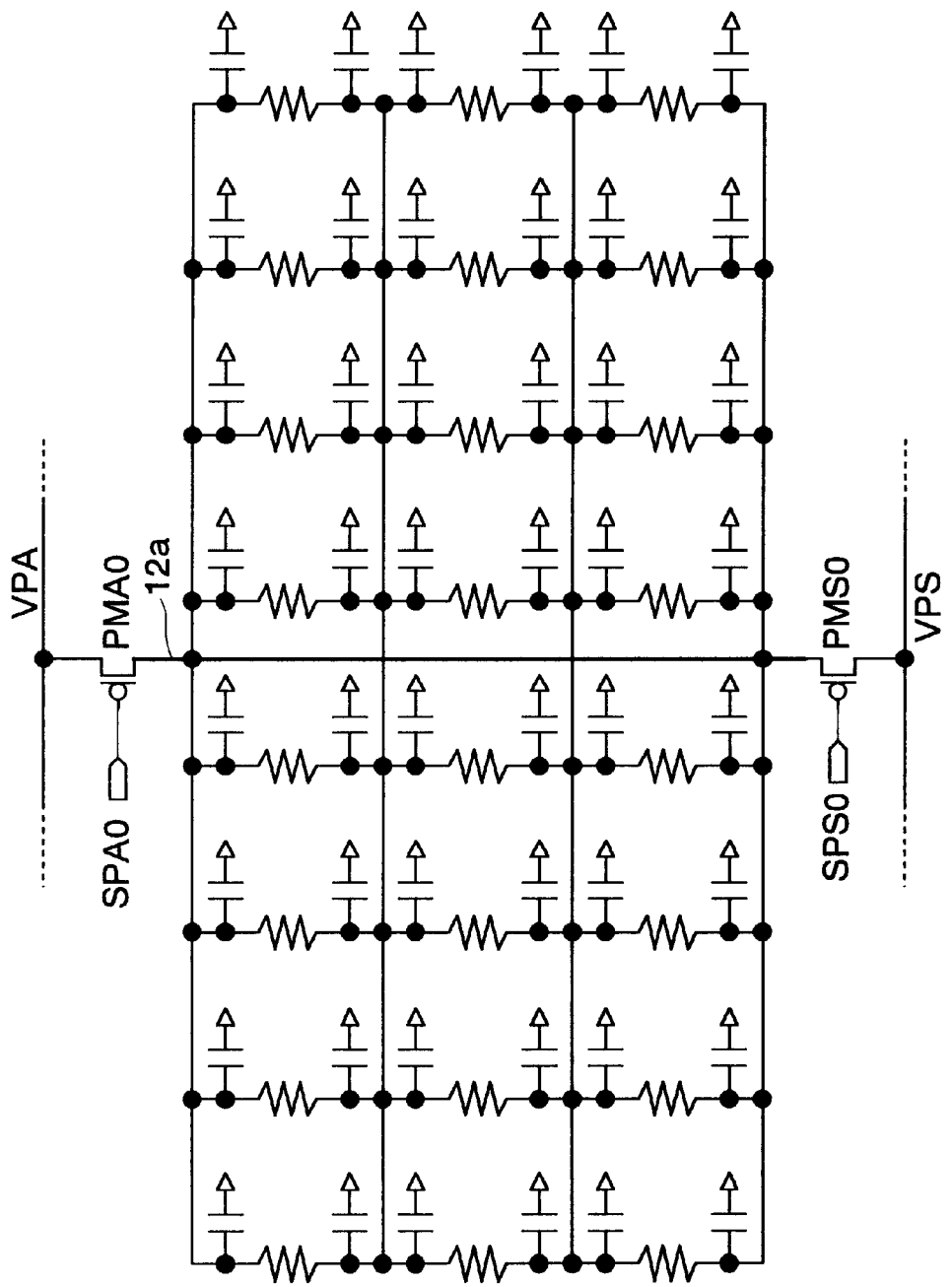
FIG. 4 is a view showing an equivalent circuit of a substrate of the circuit block in FIG. 1.

FIG. 4 shows an equivalent circuit of the substrate of the circuit block 10a. Since the substrate of the transistor has high substrate resistance and large substrate capacity, the substrate voltage does not change sharply when the pMOS transistor PMA0 (or PMS0) is turned off.

Figure 5:
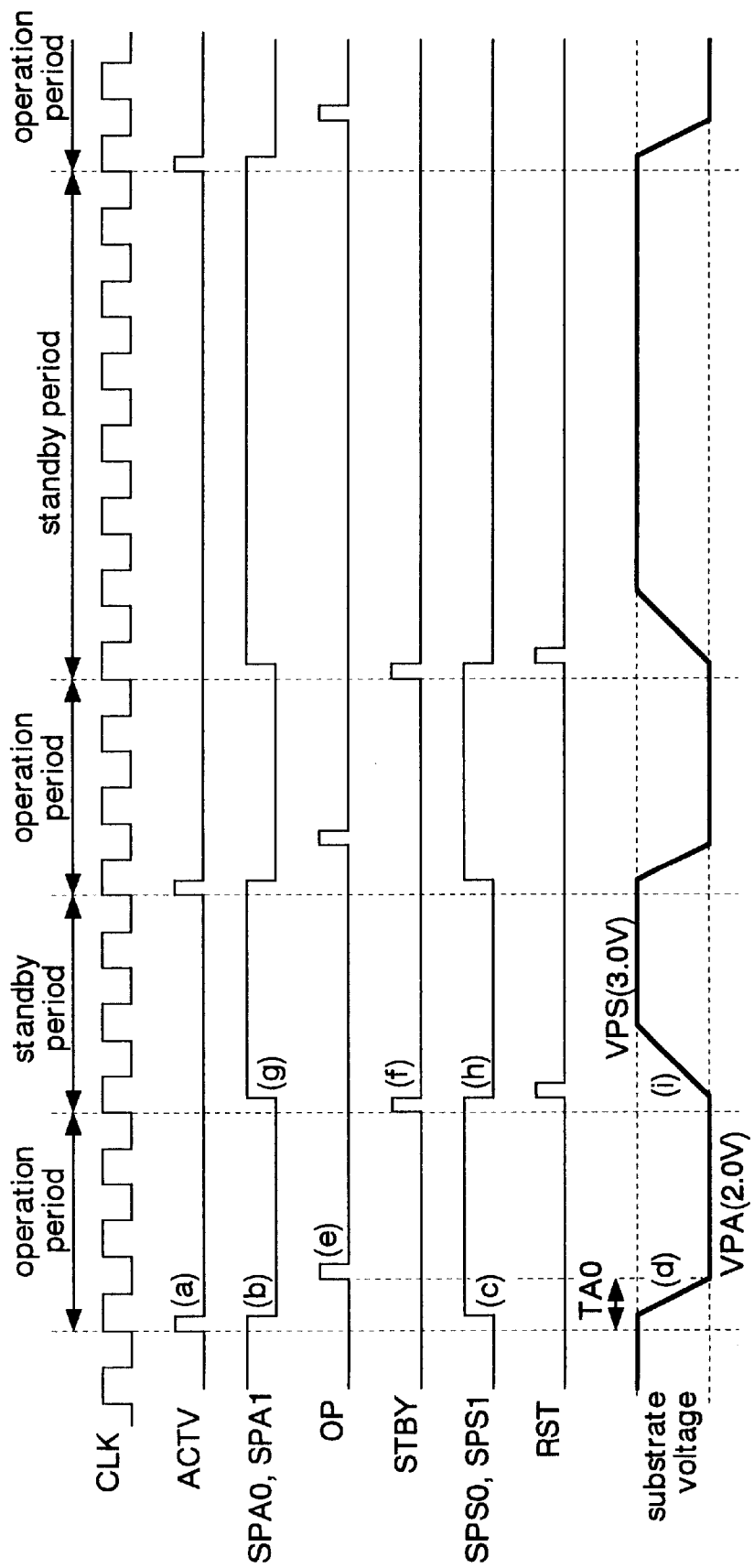
FIG. 5 is a timing chart showing the operations of the first embodiment.

FIG. 5 shows an outline of the operations of the above-described DRAM. In this embodiment, the circuit block is allowed to operate for a period of three clock cycles, and standby periods of arbitrary clock cycles is inserted during the operation period. In this example, the circuit blocks 10a, 10b are simultaneously switched between the operation state and the standby state.

First, when the operation of the circuit blocks 10a, 10b start, an active signal ACTV is generated inside the DRAM (FIG. 5(a)). The switching signals SPA0, SPA1 and the switching signals SPS0, SPS1 change to the low level and a high level, respectively, in synchronization with the active signal ACTV (FIG. 5(b), (c)). After the switching signals SPA0, SPA1 change to the low level and the switching signals SPS0, SPS1 change to the high level, the substrate voltage of the pMOS transistor (internal transistor) changes from the second substrate voltage VPS to the first substrate voltage VPA (FIG. 5(d)).

Here, an operation signal OP for starting the operation of the circuits in the circuit blocks 10a, 10b is activated after a period TA0 from the time when the active signal ACTV is activated (FIG. 5(e)). In order to operate the circuits in the circuit blocks 10a, 10b normally, it is required that the substrate voltage is changed to the first substrate voltage VPA before the operating signal OP is activated. For this reason, the drivability of the pMOS transistors PMA0, PMA1 shown in FIG. 1 is set according to the period TA0.

Since the substrate voltage is shallow during the operation period of the circuits, a threshold voltage of the pMOS transistor of the respective circuit blocks 10a, 10b is lowered as compared with that during the standby period. As a result, the transistor operates quickly, and access time and the like of the DRAM can be shortened.

Next, the circuit operation completes, and the circuit blocks 10a, 10b change to the standby state (non-operation state). Here, a standby signal STBY is generated in the DRAM (FIG. 5(f)). The switching signals SPA0, SPA1 and the switching signals SPS0, SPS1 change to the high level and the low level, respectively, in synchronization with the standby signal STBY (FIG. 5(g), (h)). After the switching signals SPA0, SPA1 change to the high level and the switching signals SPS0, SPS1 change to the low level, the substrate voltage of the pMOS transistor (internal transistor) changes from the first substrate voltage VPA to the second substrate voltage VPS (FIG. 5(i)).

Since the substrate voltage is deep during the standby period, the threshold voltage of the pMOS transistor in the circuit block 10a (or 10b) is heightened as compared with that during the operation period. As a result, a sub-threshold leakage current decreases and a standby current can be reduced. Since the power source voltage is supplied to the circuit blocks 10a, 10b during the standby period as well, held data is not destroyed even when a latch circuit is included in the circuit block 10a (or 10b).

Moreover, the transistor does not operate during the standby period, and therefore, it is unnecessary to speedily change the substrate voltage to the second substrate voltage VPS. Therefore, the drivability of the pMOS transistors PMS0, PMS1 shown in FIG. 1 may be smaller than that of the pMOS transistors PMA0, PMA1. Thus, the substrate voltage is gradually changed to the predetermined voltage VPS and charging/discharging currents of the substrate are dispersed in switching from the operation state to the non-operation state, so that current consumption (peak current) in the switching decreases as compared with the conventional art. Namely, the standby current can be further reduced. Further, the circuit scale of a substrate voltage generating circuit for generating the second substrate voltage VPS may be small.

Incidentally, by setting the substrate voltage of the respective circuit blocks 10a, 10b independently according to the operation of each of the blocks 10a, 10b, the current consumption can be further reduced.

As described above, in this embodiment, it is possible to operate the pMOS transistors (internal transistors) quickly during the operation of the circuit blocks 10a, 10b, and to reduce the standby current during the non-operation of the circuit blocks 10a, 10b. Moreover, the substrate voltage is gradually changed when the circuit blocks 10a, 10b are switched from the operation state to the non-operation state, so that the current consumption during the switching can be reduced and the standby current during the non-operation state can be further reduced. Since the substrate voltage is speedily changed when the circuit blocks 10a, 10b are switched from the non-operation state to the operation state, it is possible to allow the circuit blocks 10a, 10b to be ready for the operation speedily.

The ON resistance of the respective pMOS transistors PMS0, PMA0, PMS1, PMA1 is set according to the transistor's size, and therefore, the ON resistance can be adjusted easily and accurately.

The pMOS transistors PMS0, PMA0, PMS1, PMA1 are respectively formed corresponding to the circuit blocks 10a, 10b, each of which operates independently, and hence it is possible to set the substrate voltage of the pMOS transistors (internal transistors) according to the operation state of each of the circuit blocks 10a, 10b and to further reduce the current consumption.

Figure 6:
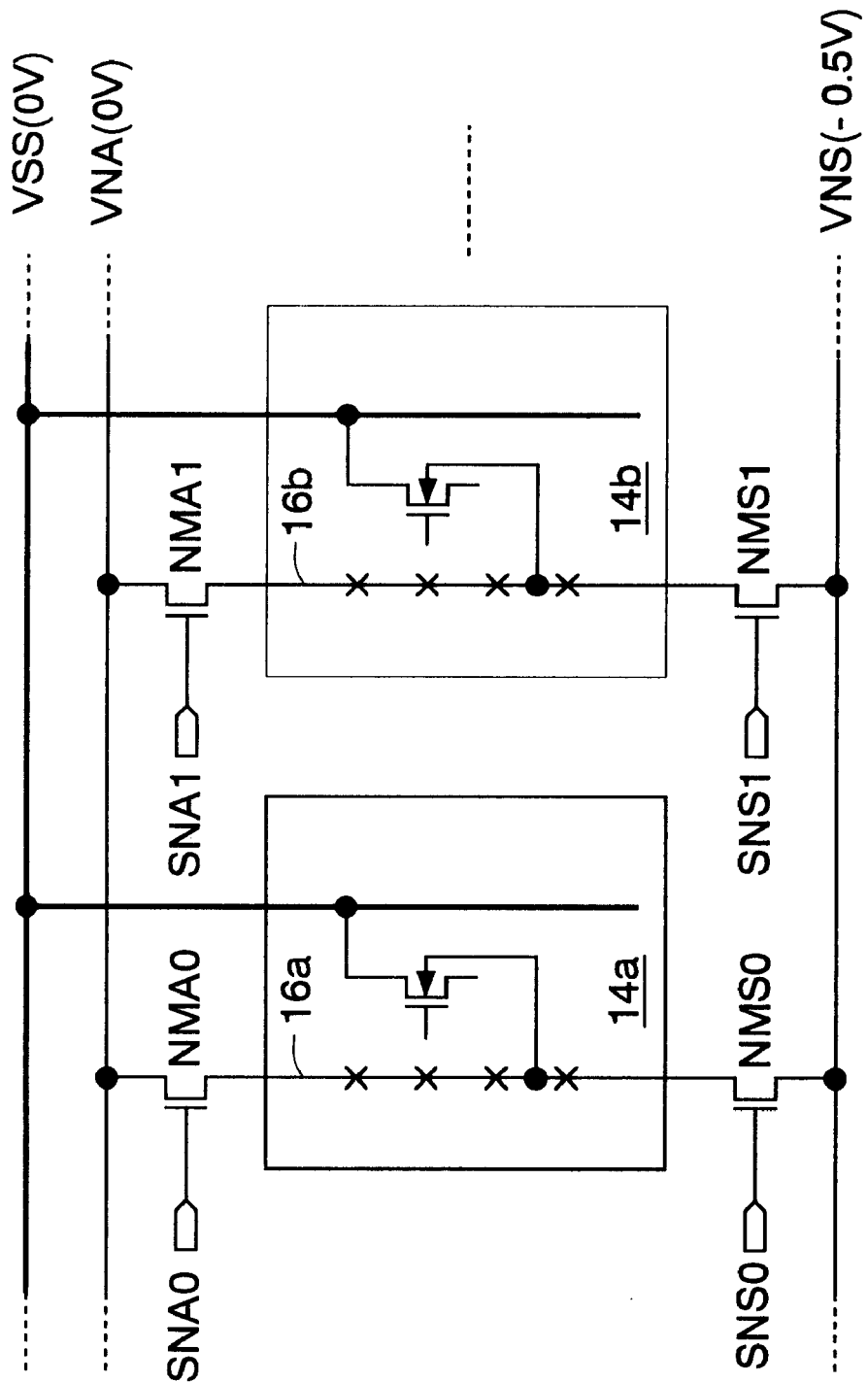
FIG. 6 is a block diagram showing a main part of a second embodiment according to the present invention.

FIG. 6 shows a second embodiment of the semiconductor integrated circuit according to the present invention. Detailed explanations about the same elements as those of the first embodiment will be omitted. This semiconductor integrated circuit is formed on a silicon substrate as DRAM of a clock synchronous type, by using a CMOS process. FIG. 6 shows a layout area of nMOS transistors in a peripheral circuit of the DRAM. The DRAM includes a layout area of pMOS transistors which are not shown in the drawing.

A plurality of circuit blocks 14a, 14b, . . . , each of which operates independently, are formed in the nMOS transistor area of the DRAM. A power source line VSS for supplying a power source voltage (ground voltage=0 V) is wired to the circuit blocks 14a, 14b. The power source line VSS is connected to a source of the nMOS transistors (internal transistors) in the respective circuit blocks 14a, 14b. The structures of the circuit blocks 14a, 14b are the same, and hence the circuit block 14a on the left side of the drawing will be explained in the following explanation.

A substrate of the circuit block 14a is connected to a wire 16a via contacts shown by "X" in the drawing. The wire 16a is connected to a drain of an nMOS transistor NMA0 (the first transistor) and a drain of an nMOS transistor MNS0 (the second transistor). A source of the nMOS transistor NMA0 is connected to a first substrate voltage line VNA which supplies a first substrate voltage (0 V). A source of the nMOS transistor NMS0 is connected to a second substrate voltage line VNS which supplies a second substrate voltage (−0.5 V).

A gate of the nMOS transistor NMA0 is controlled by a switching signal SNA0. The switching signal SNA0 changes to the high level when the circuit block 14a is in the operation state, to turn on the nMOS transistor NMA0. A gate of the nMOS transistor NMS0 is controlled by a switching signal SNS0. The switching signal SNS0 changes to the high level when the circuit block 14a is in the non-operation state (standby state), to turn on the nMOS transistor NMS0.

In the circuit block 14b on the right side of the drawing, a gate of an nMOS transistor NMA1 is controlled by a switching signal SNA1, and a gate of an nMOS transistor NMS1 is controlled by a switching signal SNS1. The switching signal SNA1 changes to the high level when the circuit block 14b is in the operation state, to turn on the nMOS transistor NMA1. The switching signal SNS1 changes to the high level when the circuit block 14b is in the non-operation state (standby state), to turn on the nMOS transistor NMS1. Namely, a substrate of the circuit block 14b is connected to the first substrate voltage line VNA or the second substrate voltage line VNS via a wire 16b.

Thus, the substrates of the circuit blocks 14a, 14b are connected to the substrate voltage lines VNA, VNS, via the nMOS transistors NMA0, NMA1, NMS0, NMS1 which can be operated independently. For this reason, the substrate voltage of each circuit block 14a, 14b can be set independently according to the operation of each block.

Figure 7:
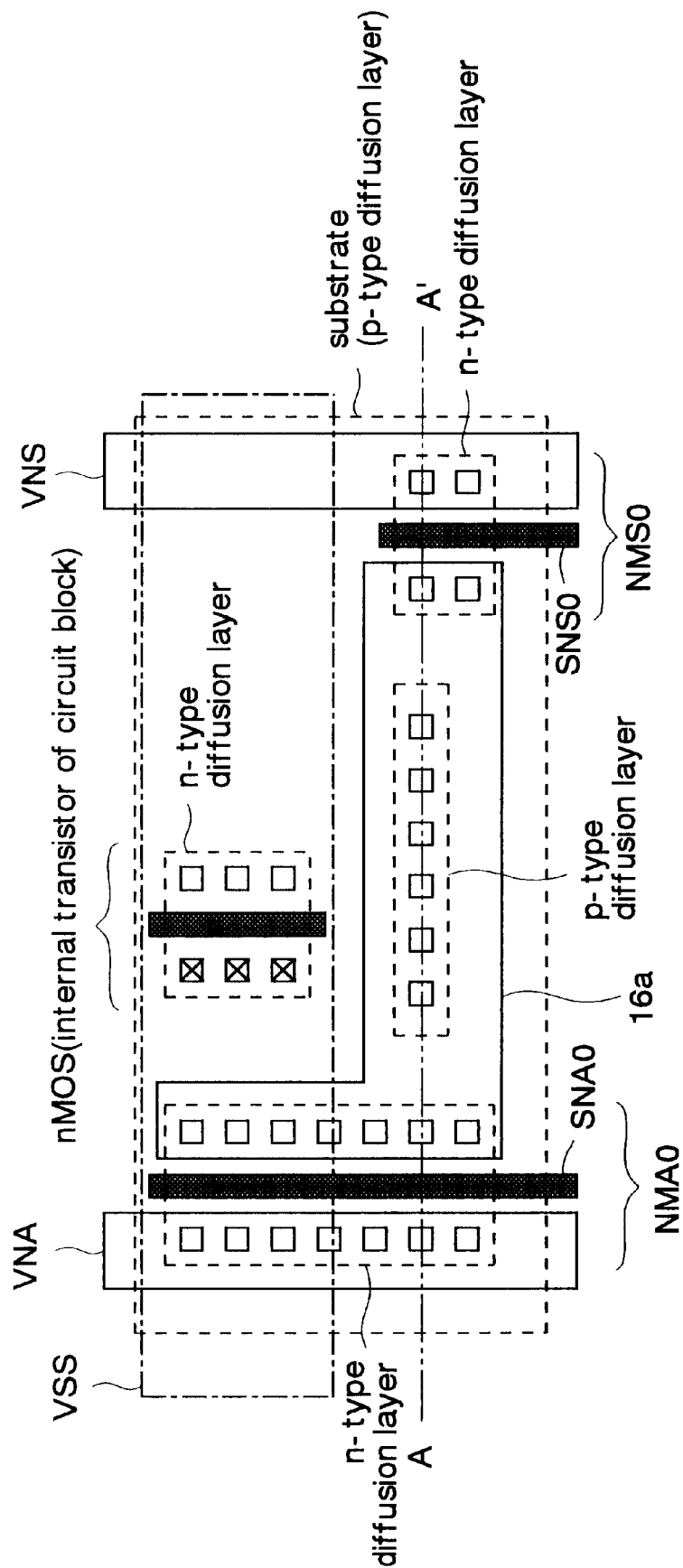
FIG. 7 is a view showing a layout of a circuit block in FIG. 6 in detail.

FIG. 7 shows a layout of the circuit block 14a shown in FIG. 6. Note that layouts of other circuit blocks (14b and the like) are the same as that shown in FIG. 7, although not particularly shown in the drawing.

A ratio W1/L1 (transistor size) between a gate width W1 and a channel length L1 of the nMOS transistor NMA0 is formed to nearly quadruple a ratio W2/L2 between a gate width W2 and a channel length L2 of the nMOS transistor NMS0. In other words, ON resistance of the nMOS transistor NMS0 nearly quadruples ON resistance of the nMOS transistor NMA0. incidentally, the channel lengths L1, L2 are equal to each other in this embodiment. The source of the nMOS transistor in the circuit block 14a is connected to the power source line VSS via contacts shown by "X" in the drawing.

Figure 8:
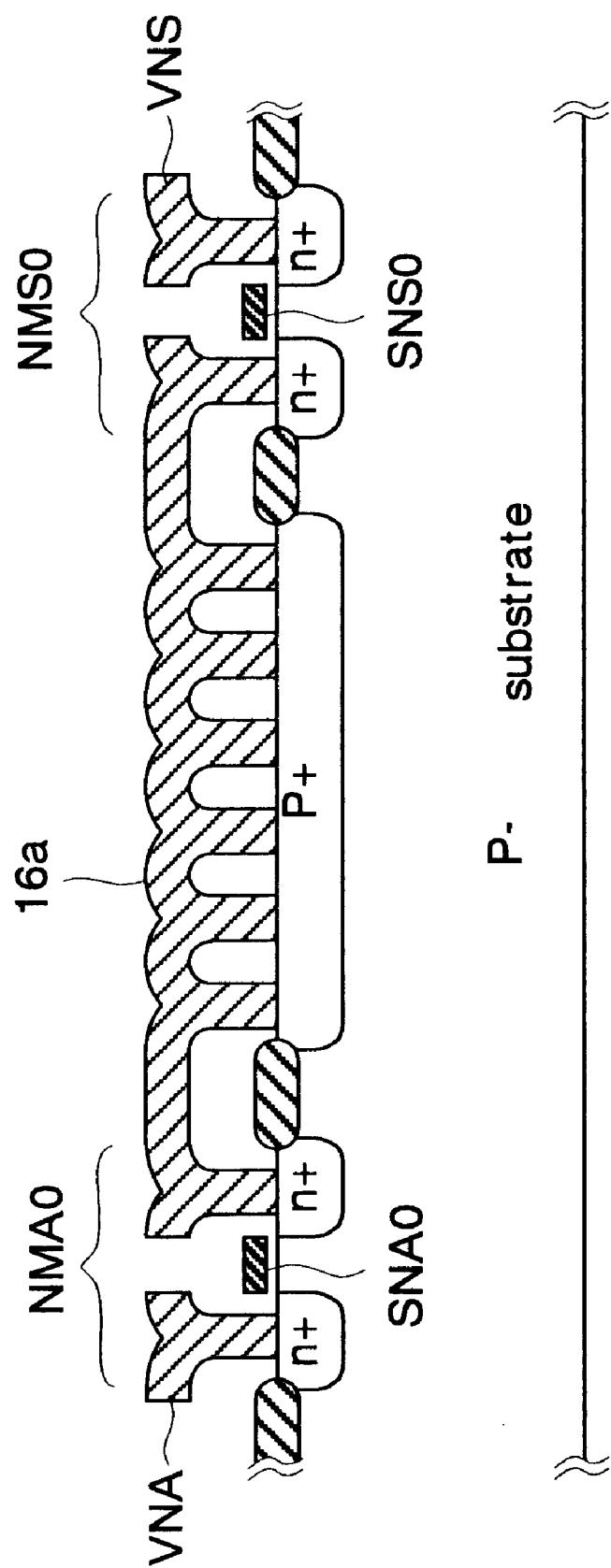
FIG. 8 is a sectional view taken along the A–A' line in FIG. 7.

FIG. 8 is a sectional view taken along the A–A' line in FIG. 7. In the drawing, "p−" shows a lightly doped p-type diffusion layer. The wire 16a is connected to the first substrate voltage line VNA and the second substrate voltage line VNS via the nMOS transistor NMA0 and the nMOS transistor NMS0, respectively. The wire 16a is connected to the substrate of the nMOS transistor (p-well region) via contact holes and the p-type diffusion layer.

Figure 9:
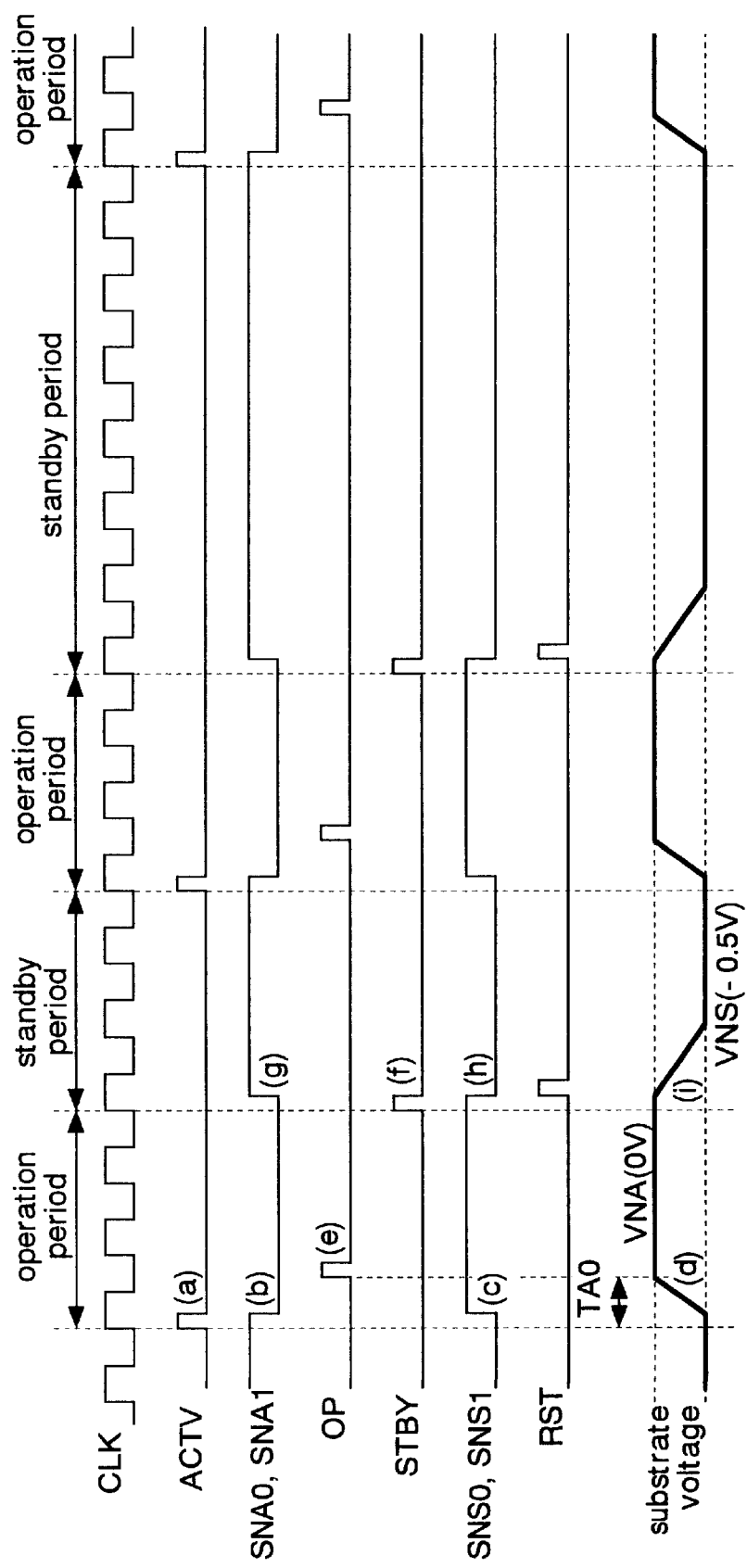
FIG. 9 is a timing chart showing the operations of the second embodiment.

FIG. 9 shows an outline of the operations of the above-described DRAM. The same numerals and symbols are given to designate the same operations as those in the first embodiment (FIG. 5), and detailed explanations thereof are omitted.

During the operation of the circuit blocks 14a, 14b, the switching signals SNA0, SNA1 and the switching signals SNS0, SNS1 change to the low level and the high level, respectively, (FIG. 9(b), (c)), and the substrate voltage of the nMOS transistors (internal transistors) changes from the second substrate voltage VNS to the first substrate voltage VNA (FIG. 9(d)). The substrate voltage of the circuit blocks 14a, 14b changes to the first substrate voltage VNA before an operating signal OP is activated, similarly to the first embodiment.

Next, the circuit operation completes and the circuit blocks 14a, 14b change to the standby state (non-operation state). The switching signals SNA0, SNA1 and the switching signals SNS0, SNS1 change to the high level and the low level, respectively, (FIG. 9(g), (h)), and the substrate voltage of the nMOS transistors (internal transistors) changes from the first substrate voltage VNA to the second substrate voltage VNS (FIG. 9(i)). Since the substrate voltage gradually changes to the predetermined voltage VNS in switching from the operation state to the non-operation state, current consumption (peak current) in the switching decreases as compared with the conventional art.

Incidentally, by setting the substrate voltage of the respective circuit blocks 14a, 14b independently according to the operation of each block, similarly to the first embodiment, the current consumption can be further reduced. The same effects as those of the above-described first embodiment can be obtained in this embodiment as well.

Figure 10:
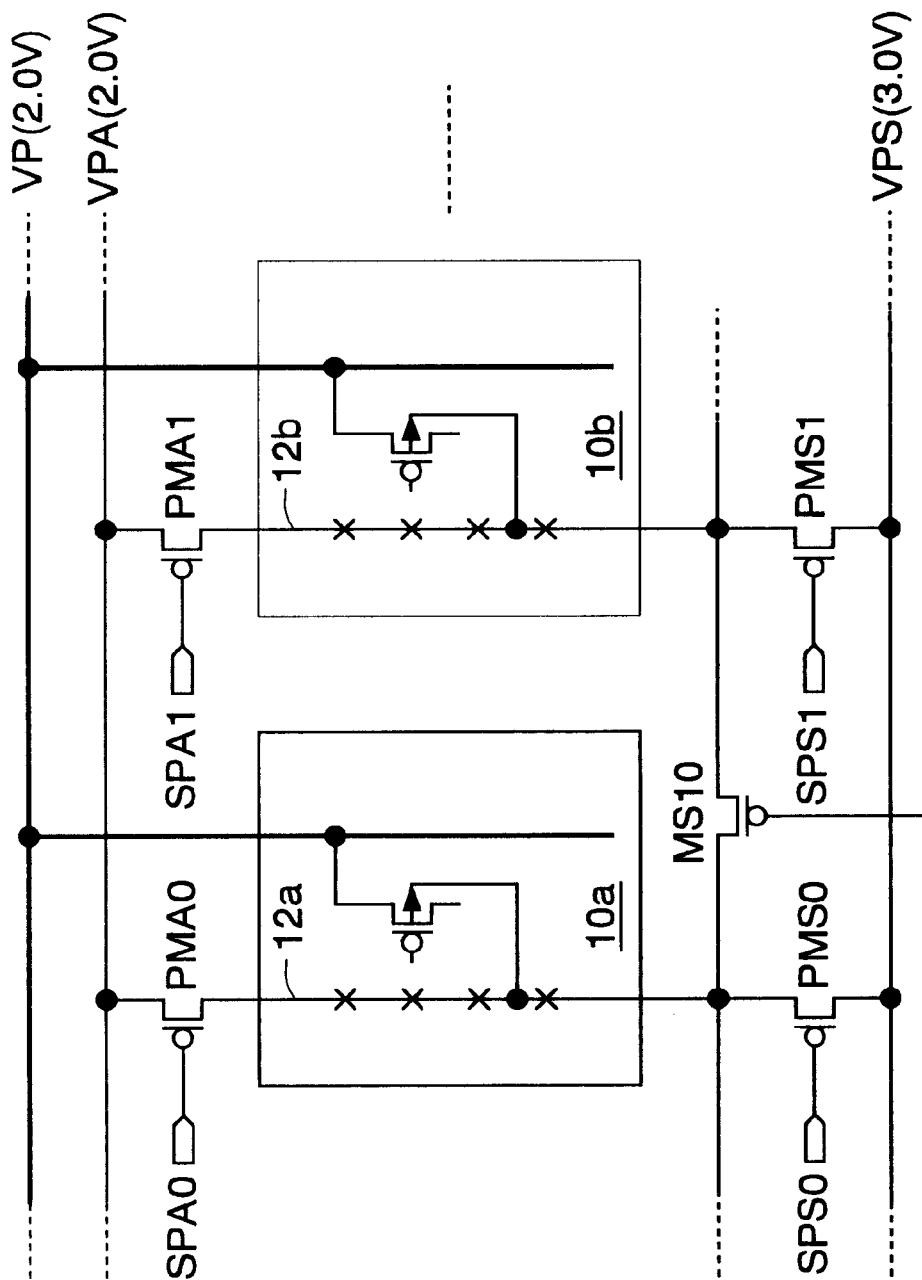
FIG. 10 is a block diagram showing a main part of a third embodiment according to the present invention.

FIG. 10 shows a third embodiment of the semiconductor integrated circuit according to the present invention. The same numerals and symbols are given to designate the same elements as those in the first embodiment, and detailed explanations thereof are omitted. DRAM according to this embodiment is structured by that of the first embodiment (FIG. 1) added with a pMOS transistor MS10 (the third transistor). The other structure is the same with that of the first embodiment.

A source and a drain of the PMOS transistor MS10 are connected to wires 12a, 12b, respectively. That is, substrates of pMOS transistors (internal transistors) in circuit blocks 10a, 10b are connected to each other via the pMOS transistor MS10. A gate of the pMOS transistor MS10 is controlled by an equalizing signal EQ. The equalizing signal EQ is generated by, for example, AND logic (negative logic) of switching signals SPS0, SPS1. Namely, the equalizing signal EQ changes to the low level when both of the circuit blocks 10a, 10b are in the non-operation state (standby state), to turn on the PMOS transistor MS10.

This embodiment is effective especially when the circuit block (10a or 10b) in the operation state shifts to the non-operation state, in the case when one of the circuit blocks 10a, 10b is operating and the other is not operating. Hereinafter, the case of switching the circuit block 10a from the operation state to the non-operation state when the circuit block 10b is not operating will be explained as an example.

First, a second substrate voltage VPS is supplied via a pMOS transistor PMS1 to the substrate of the circuit block 10b which is in the non-operation state. Namely, the PMOS transistor PMS1 is on because the switching signal SPS1 is at the low level. Next, the circuit block 10a switches from the operation state to the non-operation state. At this time, the switching signal SPS0 changes to the low level and the second substrate voltage VPS is supplied via a pMOS transistor PMS0 to the substrate of the circuit block 10a. Thereby, both of the switching signals SPS0, SOS1 are at the low level, and therefore, the equalizing signal EQ is activated and the pMOS transistor MS10 is turned on. Therefore, the second substrate voltage VPS is supplied to the substrate of the circuit block 10a, not only via the pMOS transistor PMS0, but also via the pMOS transistor PMS1 which corresponds to the adjacent circuit block 10b.

The same effects as those of the above-described first embodiment can be obtained in this embodiment as well. Moreover, the pMOS transistors PMS0, PMS1 are shared by a plurality of the circuit blocks 10a, 10b, whereby the substrate of each of the circuit blocks 10a, 10b can be speedily set to the predetermined voltage VPS when it shifts from the operation state to the non-operation state.

Figure 11:
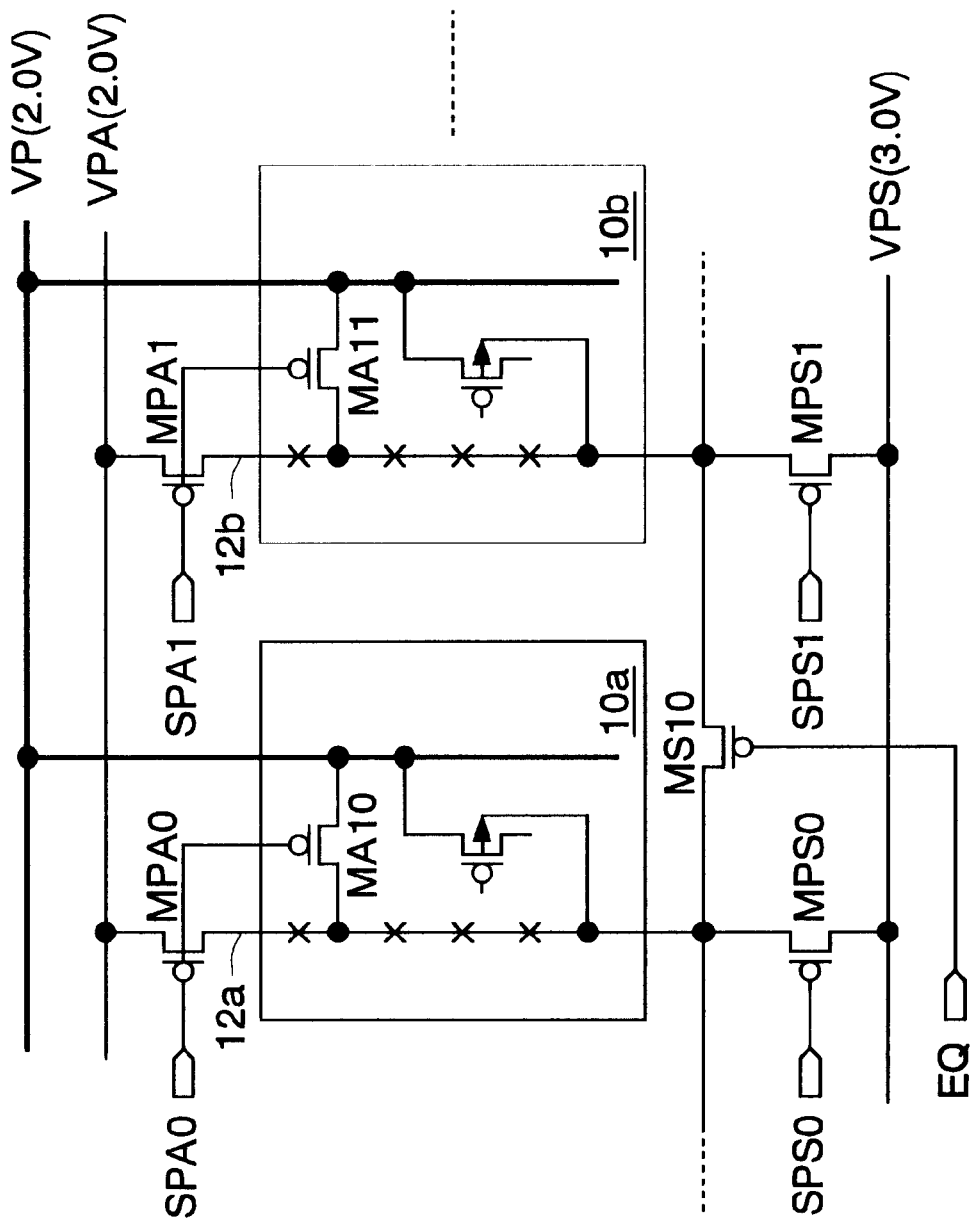
FIG. 11 is a block diagram showing a main part of a fourth embodiment according to the present invention.

FIG. 11 shows a fourth embodiment of the semiconductor integrated circuit according to the present invention. The same numerals and symbols are given to designate the same elements as those in the first and the third embodiments, and detailed explanations thereof are omitted. DRAM of this embodiment is structured by further adding pMOS transistors MA10, MA11 (the fourth transistors) to that of the third embodiment (FIG. 10). The other structure is the same as that of the third embodiment.

The pMOS transistor MA10 is formed corresponding to a circuit block 10a. A source and a drain of the pMOS transistor MA10 are connected to a wire 12a and a power source line VP for supplying the power source voltage, respectively. A gate of the pMOS transistor MA10 is controlled by a switching signal SPA0 which controls a pMOS transistor MPA0. The pMOS transistor MA11 is formed corresponding to a circuit block 10b. A source and a drain of the pMOS transistor MA11 are connected to a wire 12b and the power source line VP, respectively. A gate of the pMOS transistor MA11 is controlled by a switching signal SPA1 which controls a pMOS transistor MPA1.

When, for example, the circuit block 10a shifts from the non-operation state to the operation state, the pMOS transistors MPA0, MA10 turn on at the same time. For this reason, a substrate of the PMOS transistor (internal transistor) in the circuit block 10a changes to 2.0 V, not only via the pMOS transistor MPA0 but also via the pMOS transistor MA10. Since the substrate voltage is changed by using the power source line VP, as well as a first substrate voltage line VPA, the substrate voltage changes more speedily than the case of the first embodiment.

The same effects as those of the above-described first embodiment can be obtained in this embodiment as well. Moreover, it is possible to allow the circuit block 10a (or 10b) to be ready for the operation more speedily when the circuit block 10a (or 10b) shifts from the non-operation state to the operation state. Further, since the pMOS transistors MA10, MA11 can be controlled by using existing signal lines, the number of the signal lines can be reduced and a layout area of the signal lines can be reduced.

Figure 12:
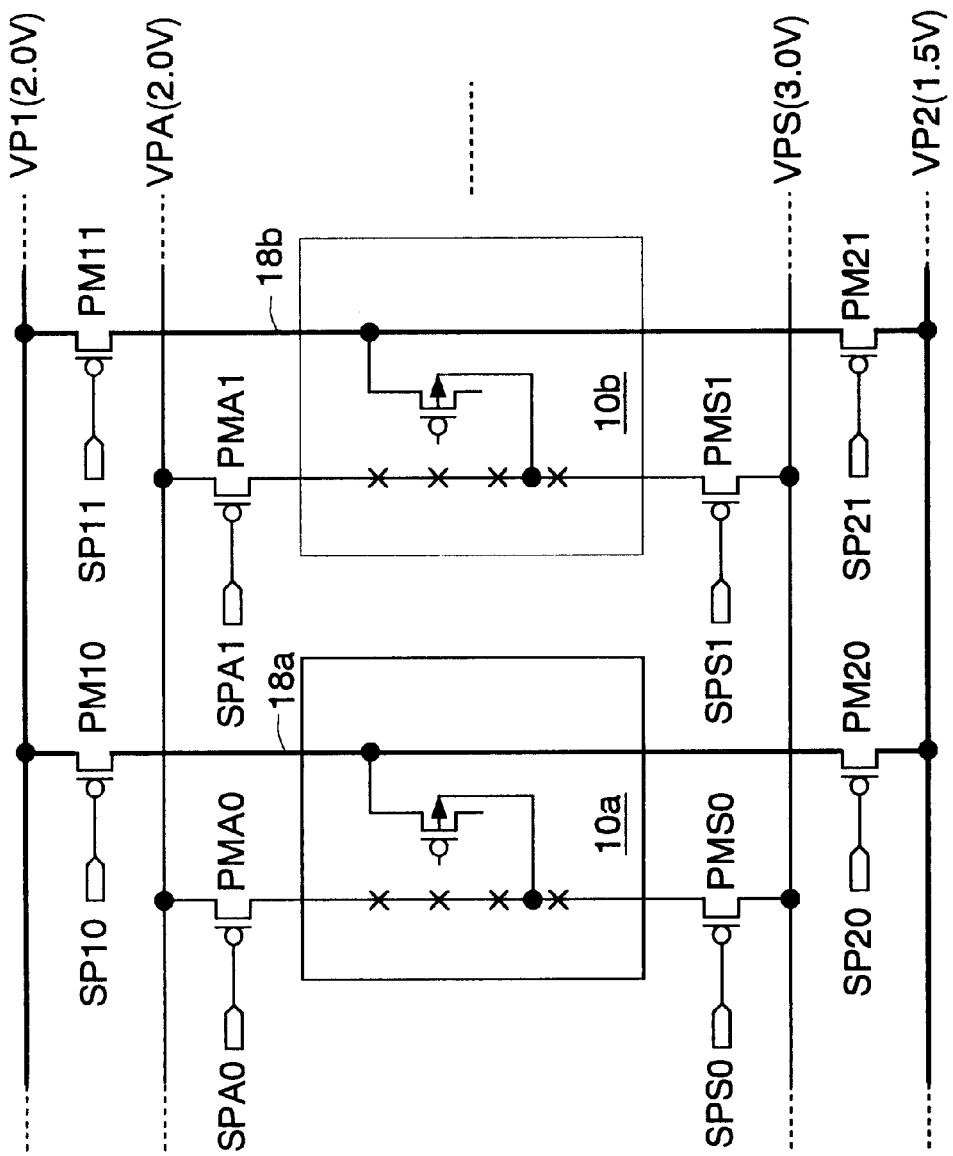
FIG. 12 is a block diagram showing a main part of a fifth embodiment according to the present invention.

FIG. 12 shows a fifth embodiment of the semiconductor integrated circuit according to the present invention. The same numerals and symbols are given to designate the same elements as those in the first embodiment, and detailed explanations thereof are omitted.

DRAM of this embodiment is structured by further adding pMOS transistors PM10, PM11 (fifth transistors) and PM20, PM21 (sixth transistors) to that of the first embodiment (FIG. 1). The other structure is the same as that of the third embodiment.

A source and a drain of the pMOS transistor PM10 are connected to a first power source line VP1 (2.0 V) and a power source line 18a of a circuit block 10a, respectively. A gate of the PMOS transistor PM10 is controlled by a switching signal SP10. A source and a drain of the pMOS transistor PM11 are connected to the first power source line VP1 and a power source line 18b of a circuit block 10b, respectively. A gate of the pMOS transistor PM11 is controlled by a switching signal SP11. A source and a drain of the pMOS transistor PM20 are connected to a second power source line VP2 (1.5 V) and the power source line 18a of the circuit block 10a, respectively. A gate of the pMOS transistor PM20 is controlled by a switching signal SP20. A source and a drain of the pMOS transistor PM21 are connected to the second power source line VP2 and the power source line 18b of the circuit block 10b, respectively. A gate of the pMOS transistor PM21 is controlled by a switching signal SP21.

The switching signals SP10, SP11 respectively change to the low level when the circuit blocks 10a, 10b are in the operation state, to turn on the pMOS transistors PM10, PM11. The switching signals SP20, SP21 respectively change to the low level when the circuit blocks 10a, 10b are in the non-operation state, to turn on the pMOS transistors PM20, PM21. Thus, each of the switching signals SP10, SP11, SP20, SP21 is controlled independently.

Figure 13:
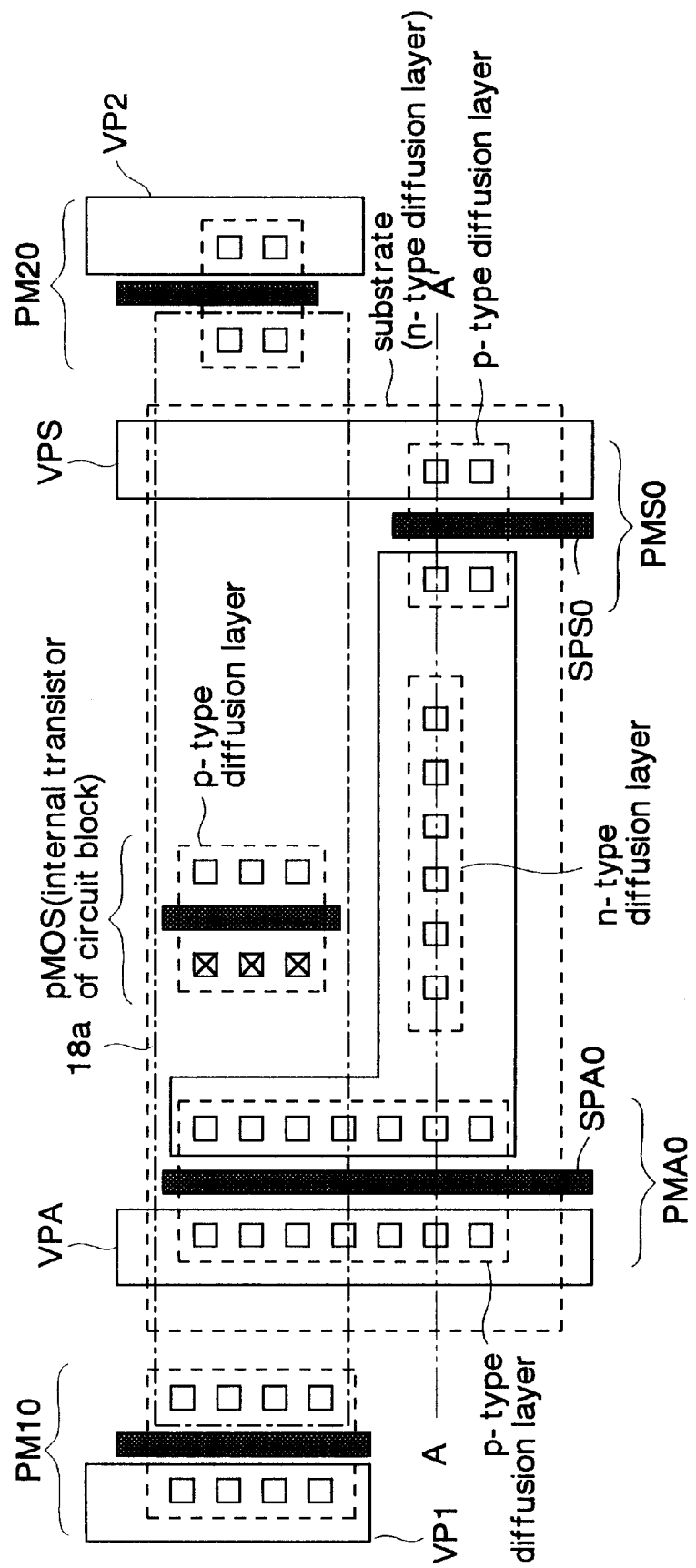
FIG. 13 is a view showing a layout of a circuit block in FIG. 12 in detail.

FIG. 13 shows a layout of the circuit block 10a shown in FIG. 12 and its peripheral area. Note that layouts of other circuit blocks (10b and the like) and its peripheral areas are the same as that shown in FIG. 13, although not particularly shown in the drawing. Detailed explanations about the same elements as those in FIG. 2 will be omitted.

A ratio W3/L3 (transistor size) between a gate width W3 and a channel length L3 of the pMOS transistor PM10 is formed to nearly triple a ratio W4/L4 between a gate width W4 and a channel length L4 of the pMOS transistor PM20. In other words, ON resistance of the pMOS transistor PM10 nearly triples ON resistance of the pMOS transistor PM20. Since the ON resistance of the respective pMOS transistors PM10, PM20 is set according to the transistor size, the ON resistance is adjusted easily and accurately. Incidentally, the channel lengths L3, L4 are equal to each other.

In this embodiment, for example, the first power source voltage VP1 (2.0 V) is supplied to the source of the pMOS transistor (internal transistor) in the circuit block 10a when the circuit block 10a is operating, and the second power source voltage VP2 (1.5 V) is supplied to the source of the pMOS transistor in the circuit block 10a when the circuit block 10a is not operating. Hence, a source-to-drain voltage of the PMOS transistor (internal transistor) increases when the circuit block 10a is in the operation state, and decreases when the circuit block 10a is in the non-operation state. Therefore, the pMOS transistor (internal transistor) operates quickly when the circuit block 10a is in the operation state, and a leakage current decreases when the circuit block 10a is in the non-operation state.

Moreover, the ON resistance of the pMOS transistor PM10 is low, and hence a source voltage of the pMOS transistor in the circuit block 10a changes speedily to the first power source voltage VP1, when the circuit block 10a switches from the operation state to the non-operation state. For this reason, it is possible to allow the circuit block 10a to be ready for the operation speedily. Similarly, the ON resistance of the pMOS transistor PM20 is high, and hence the source voltage of the pMOS transistor in the circuit block 10a relatively gradually changes to the second power source voltage VP2, when the circuit block 10a switches from the operation state to the non-operation state. For this reason, a power source current (peak current) which flows in switching from the operation state to the non-operation state is dispersed, and a standby current during the non-operation state is reduced.

The same effects as those of the above-described first embodiment can be obtained in this embodiment as well. Further, the leakage current of the internal transistor can be reduced and the standby current can be reduced when the circuit block 10a (or 10b) is in the non-operation state. In switching from the operation state to the non-operation state, the source voltage of the internal transistor decreases gradually. Hence, it is possible to minimize the peak current in the switching and to further reduce the standby current during the non-operation state.

Moreover, the internal transistor can be operated quickly when the circuit block 10a (or 10b) is in the operation state. In switching from the non-operation state to the operation state, the source voltage of the internal transistor increases speedily. Hence, it is possible to allow the circuit blocks 10a, 10b to be ready for the operation speedily.

Since the ON resistance of the respective pMOS transistors PM10, PM11, PM20, PM21 is set according to the transistor size, the ON resistance can be adjusted easily and accurately.

The respective PMOS transistors PM10, PM11, PM20, PM21 are formed corresponding to the circuit blocks 10a, 10b, each of which operates independently, whereby it is possible to set the power source voltage to be supplied to the source of the internal transistor according to the operation state of each of the circuit blocks 10a, 10b and to further reduce the current consumption.

Incidentally, in the above-described third to the fifth embodiments, the example of applying the present invention to the control of the circuit block 10a (or 10b) including the pMOS transistor (internal transistor) is explained. The present invention is not limited to the above embodiments. For example, it is suitable to apply the present invention to the control of the circuit block including the nMOS transistor (internal transistor).

In the above-described embodiments, the example of applying the present invention to the DRAM is explained. The present invention is not limited to the above embodiments. For example, it is suitable to apply the present invention to semiconductor integrated circuits such as a microcomputer and a system LSI.

The invention is not limited to the above embodiments and various modifications may be made without departing from the spirit and the scope of the invention. Any improvement may be made in part or all of the components.

What is claimed is:

1. A semiconductor integrated circuit comprising:
   a circuit block including an internal transistor;
   a first transistor for being turned on when said circuit block is in operation, to connect a substrate of said internal transistor to a first substrate voltage line; and
   a second transistor having ON resistance higher than ON resistance of said first transistor, for being turned on when said circuit block is not in operation, to connect said substrate of said internal transistor to a second substrate voltage line, and wherein
      said first and second substrate voltage lines are supplied with voltages for allowing a source-to-substrate voltage of said internal transistor during non-operation of said circuit block to be higher than a source-to-substrate voltage of said internal transistor during operation of said circuit block.

2. The semiconductor integrated circuit according to claim 1, wherein
   a ratio W1/L1 between a gate width W1 and a channel length L1 of said first transistor is larger than a ratio W2/L2 between a gate width W2 and a channel length L2 of said second transistor.

3. A semiconductor integrated circuit comprising:
   a plurality of circuit blocks individually including an internal transistor and operating independently;
   a plurality of first transistors formed respectively corresponding to said circuit blocks, for being individually turned on during operation of each of the corresponding circuit blocks, to connect substrates of each of said internal transistors to a first substrate voltage line; and
   a plurality of second transistors formed respectively corresponding to said circuit blocks, for being individually turned on during non-operation of each of the corresponding circuit blocks, to connect said substrates of each of said internal transistors to a second substrate voltage line, and wherein:
   in said first transistors and said second transistors both respectively corresponding to said clock blocks, said second transistors have ON resistance higher than ON resistance of said first transistors; and
   said first and second substrate voltage lines are supplied with voltages for allowing a source-to-substrate voltage of said internal transistors during non-operation of said circuit blocks to be higher than a source-to-substrate voltage of said internal transistors during operation of said circuit blocks.

4. The semiconductor integrated circuit according to claim 3, further comprising a third transistor for connecting, to each other, said substrates of said circuit blocks being not in operation.

5. The semiconductor integrated circuit according to claim 1, further comprising:
   a power source line for supplying a power source voltage to a source of said internal transistor in said circuit block; and
   a fourth transistor for connecting said power source line to said substrate when said circuit block is in operation.

6. The semiconductor integrated circuit according to claim 5, wherein the gates of said first transistor and said fourth transistor are controlled by a same control signal.

7. A semiconductor integrated circuit comprising:
   a circuit block including an internal transistor;
   a fifth transistor for being turned on when said circuit block is in operation, to connect a source of said internal transistor to a first power source line; and
   a sixth transistor having ON resistance higher than ON resistance of said fifth transistor, for being turned on when said circuit block is not in operation, to connect said source of said internal transistor to a second power source line having a voltage lower than a voltage of said first power source line.

8. The semiconductor integrated circuit according to claim 7, wherein
   a ratio W3/L3 between a gate width W3 and a channel length L3 of said fifth transistor is larger than a ratio W4/L4 between a gate width W4 and a channel length L4 of said sixth transistor.

9. A semiconductor integrated circuit comprising:
   a plurality of circuit blocks individually including an internal transistor and operating independently;
   a plurality of fifth transistors formed respectively corresponding to said circuit blocks, for being individually turned on during operation of each of the corresponding circuit blocks, to connect sources of each of said internal transistors to a first power source line; and
   a plurality of sixth transistors formed respectively corresponding to said circuit blocks, for being individually turned on during non-operation of each of the corresponding circuit blocks, to connect said sources of each of said internal transistors to a second power source line having a voltage lower than a voltage of said first power source line; and wherein
   in said fifth transistors and said sixth transistors both respectively corresponding to said plurality of circuit blocks, said sixth transistors have ON resistance higher than ON resistance of said fifth transistors.

* * * * *